United States Patent
Inoue et al.

(10) Patent No.: US 6,333,469 B1
(45) Date of Patent: Dec. 25, 2001

(54) WAFER-SCALE PACKAGE STRUCTURE AND CIRCUIT BOARD ATTACHED THERETO

(75) Inventors: Yasushi Inoue; Masakazu Sugimoto; Megumu Nagasawa; Takuji Okeyui; Kei Nakamura, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/353,385

(22) Filed: Jul. 15, 1999

(30) Foreign Application Priority Data

Jul. 16, 1999 (JP) .................................................. 10-202227

(51) Int. Cl.⁷ ...................................................... H05K 1/16
(52) U.S. Cl. ......................... 174/260; 361/794; 361/795; 438/113
(58) Field of Search ...................................... 438/113, 114, 438/126; 174/260, 255; 361/792, 793, 794, 795

(56) References Cited

U.S. PATENT DOCUMENTS 5,848,467 * 12/1998 Khandros ............................... 29/841
6,096,574 * 8/2000 Smith .................................. 438/106

OTHER PUBLICATIONS

Pan–Pacific Electronics Symposium published material Feb. 13, 1998.

* cited by examiner

*Primary Examiner*—Kamand Cuneo
(74) *Attorney, Agent, or Firm*—Sughrue Mion, PLLC

(57) ABSTRACT

A wafer-scale package structure in which a circuit board for rearranging electrode pads of a wafer is laminated on the wafer integrally. The circuit board can be divided into individual chip-size packages (CSPS) and which includes a layer of polyimide resin, and connection between the wafer and the circuit board is performed by solder bump, while the circuit board is stuck on the wafer with an adhesive.

14 Claims, 3 Drawing Sheets

WAFER-SCALE PACKAGE STRUCTURE AND CIRCUIT BOARD ATTACHED THERETO

BACKGROUND OF THE INVENTION

1. Field of the Invention

The present invention relates to a wafer-scale package structure for rearranging and packaging electrode pads in a lump and in the form of a wafer, and a circuit board used in such a wafer-scale package structure.

The present application is based on Japanese Patent Application No. Hei. 10-202227 which is incorporated herein by reference.

2. Description of the Related Art

With miniaturization and realization of high-performance in electronic equipments in recent years, semiconductor devices constituting the electronic equipments and multi-layer printed-wiring boards mounted with the semiconductor devices have been required to be small and thin and to have high performance and high reliability. Under such conditions, packages have been miniaturized, and semiconductor devices which are substantially as large as chips and called chip-size packages (CSPs) have been developed. Various methods have been proposed for the chip-size packages, but usually, chips subjected to dicing are packaged individually one by one. For example, often used is a method in which fine electrode pads on each chip are rearranged in the form of a grid and sealed with resin or the like.

However, since chips cut out of a wafer are packaged individually one by one, the above-mentioned method has problems that the productivity deteriorates, the cost increases, and so on.

SUMMARY OF THE INVENTION

Taking the foregoing situation into consideration, it is an object of the present invention to provide a wafer-scale package structure and a circuit board used in the wafer-scale package structure which are high in productivity and low in cost.

In order to achieve the object, a first gist of the present invention is in a wafer-scale package structure arranged so that a circuit board for rearranging electrode pads of a wafer is laminated on the wafer integrally, wherein the circuit board can be divided into individual chip-size packages (CSPS) and includes an insulating layer made from polyimide resin as a main ingredient, and connection between the wafer and the circuit board is performed by solder, while the circuit board is laminated on the wafer with an adhesive. Further a second gist of the present invention is in a circuit board for use in the above-mentioned wafer scale structure so as to rearrange electrode pads of the wafer, wherein solder bumps are formed in electrode portions of the circuit board corresponding to the electrode pads of the wafer to make connections between the electrode portions and the electrode pads.

That is, a wafer-scale package structure according to the present invention is designed so that a circuit board for rearranging electrode pads of a wafer is laminated on this wafer in a lump. The circuit board is a circuit board which can be divided into individual chip-size packages (CSPS) and which is constituted by an insulating layer containing polyimide resin as a main ingredient. The connection between the wafer and the circuit board is performed by solder, while the circuit board is stuck on the wafer by an adhesive. In such a manner, in the wafer-scale package structure according to the present invention, chips subjected to dicing are not packaged individually one by one, but the chips are subject to rearrangement of electrode pads and at the same time they are packaged in a lump in the form of a wafer, and thereafter they are cut into individual CSPs. Accordingly, the productivity becomes high, and the cost can be reduced. In addition, in the circuit board according to the present invention, solder bumps are formed respectively in electrode portions of the circuit board. The connection between the wafer and the circuit board is performed by means of these solder bumps, so that all the connections can be performed in a lump. Accordingly, the electric reliability is also extremely high. The solder also includes a solder free from lead like Bi—Sn, Ag—Sn or the like.

In the wafer-scale package structure according to the present invention, the above-mentioned insulating layer includes metal foil with low thermal expansivity. In this case, the thermal expansivity of the circuit board can be reduced by this metal foil and made close to the thermal expansivity of the wafer. Accordingly, a warp of the wafer is reduced.

In the circuit board according to the present invention, solder bumps are formed in electrode portions of the circuit board corresponding to electric connection portions of a mother board to make electric connections between the circuit board and the mother board. In this case, it is not necessary to mount solder balls in addition after the circuit board is stuck on the wafer.

In the circuit board according to the present invention, the melting point of the solder provided in the electrode portions of the circuit board corresponding to the electrode pads is made higher than the melting point of the solder provided in the electrode portions of the circuit board corresponding to the electric connection portions of the mother board. In this case, there is no fear that the solder in the wafer-scale package structure (solder for connection with the electrode pads) melts at a temperature at which the circuit board is mounted on the mother board. Accordingly, there is no fear that the reliability of the connection is reduced by the mounting of the circuit board onto the mother board.

Features and advantages of the invention will be evident from the following detailed description of the preferred embodiments described in conjunction with attached drawings.

DETAILED DESCRIPTION OF THE PREFERRED EMBODIMENTS

The present invention will be described in detail.

A wafer-scale package structure according to the present invention is constituted by a wafer and a circuit board for rearranging electrode pads of this wafer.

The circuit board is constituted by a copper circuit as a conductor and an insulating layer material, preferably, made of polyimide resin. The insulating material layer can be also selected from the group consisting of epoxy resin, phenol resin, glass epoxy resin, or the like.

In the wafer-scale package structure, solder is used for connecting the electrode pads of the wafer with the copper circuit of the circuit board. Although this solder may be prepared in the form of solder bumps on the electrode pads of the wafer, it is preferable to form solder bumps in the copper circuits of the circuit board in advance. According to this method, it is possible to make all connections in a lump, unlike connections by wire-bonding. In addition, the electrical reliability is also extremely high because solder is used.

A method of manufacturing the wafer-scale package structure will be described.

Figure 1:
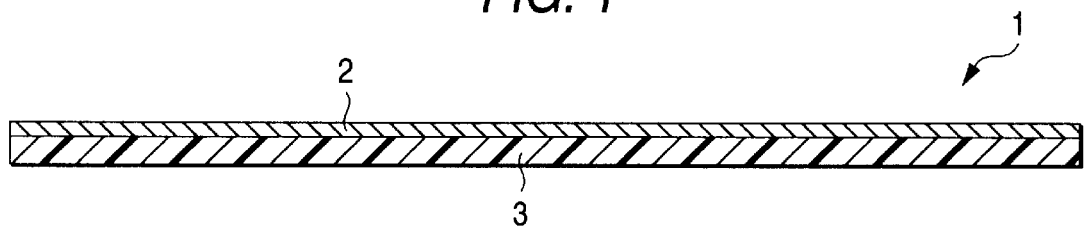
FIG. 1 is an explanatory view showing a manufacturing process of an embodiment of a wafer-scale package structure according to the present invention.
Figure 2:
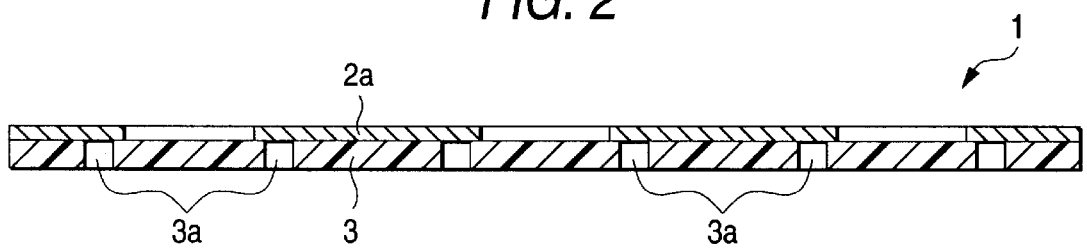
FIG. 2 is an explanatory view showing the above-mentioned manufacturing method of the wafer-scale package structure.
Figure 3:
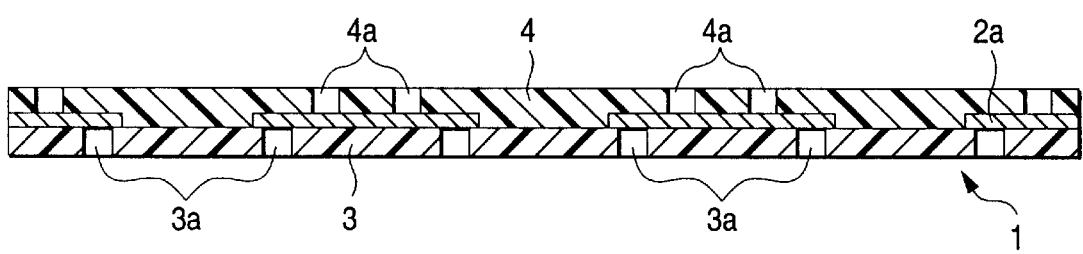
FIG. 3 is an explanatory view showing the above-mentioned manufacturing method of the wafer-scale package structure.
Figure 4:
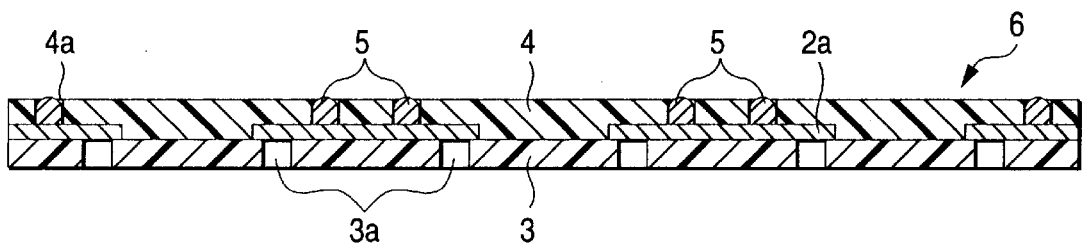
FIG. 4 is an explanatory view showing the above-mentioned manufacturing method of the wafer-scale package structure.
Figure 5:
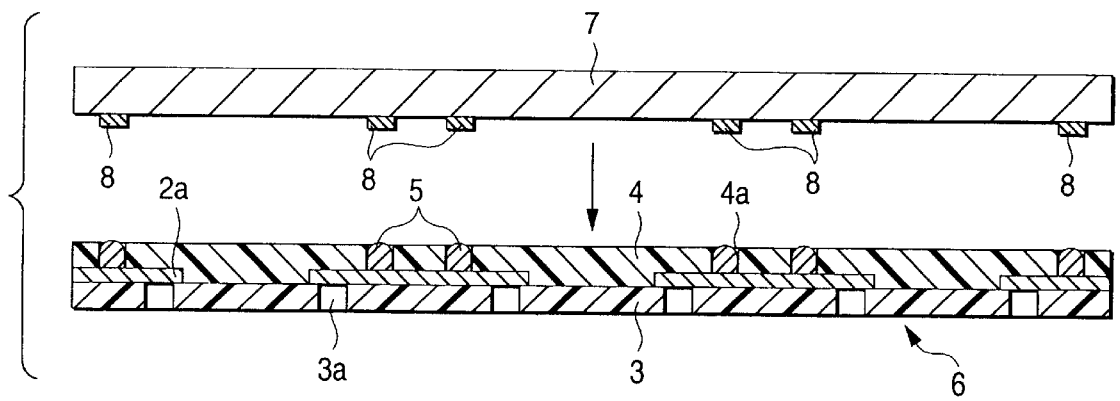
FIG. 5 is an explanatory view showing the above-mentioned manufacturing method of the wafer-scale package structure.
Figure 6:
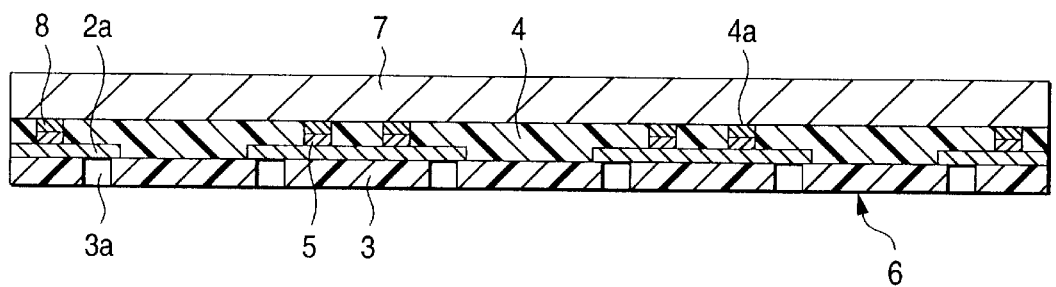
FIG. 6 is an explanatory view showing the above-mentioned manufacturing method of the wafer-scale package structure.
Figure 7:
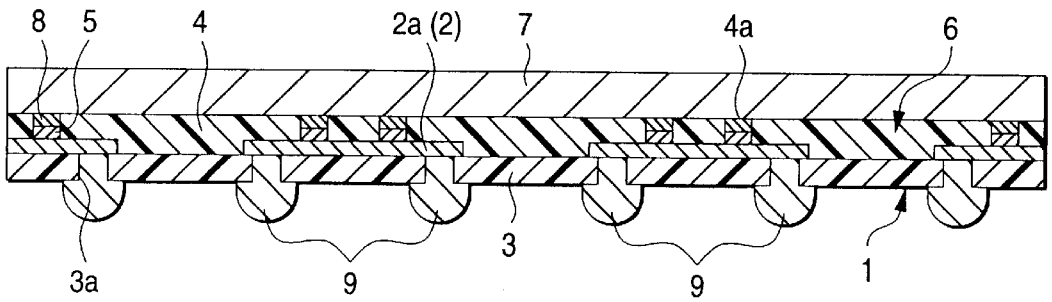
FIG. 7 is an explanatory view showing the above-mentioned manufacturing method of the wafer-scale package structure.
Figure 8:
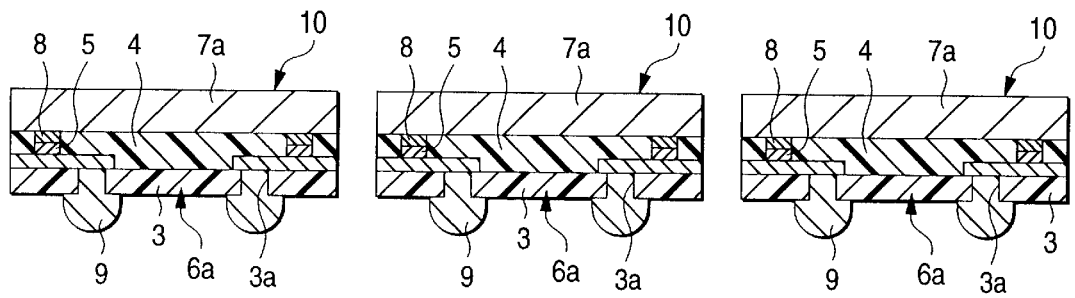
FIG. 8 is an explanatory view showing the state where the above-mentioned wafer-scale package structure is cut into CSPs.

That is, first, a two-layer base 1 constituted by a copper layer 2 and a polyimide resin layer (insulating layer) 3 is prepared (see FIG. 1). Next, as shown in FIG. 2, the copper layer 2 of the two-layer base 1 is etched to form a circuit 2a for rearranging electrode pads 8 of a wafer 7 (see FIG. 5). After that, aperture portions 3a are formed in the polyimide resin layer 3. Next, as shown in FIG. 3, the surface of the circuit 2a is coated with an adhesive 4 and dried up. After that, apertures are formed in the dried surface, and solder bumps 5 are formed in these aperture portions 4a respectively (see FIG. 4). Otherwise, solder bumps 5 may be formed after an adhesive sheet (not shown) provided with aperture portions 4a by a drill or the like in advance is put in position on the circuit 2a and temporarily bonded with the surface of the circuit 2a. In such a manner, a circuit board 6 for rearranging the electrode pads 8 of the wafer 7 is manufactured. This circuit board 6 is designed so that it can be divided into individual CSPs as shown in FIG. 8. Next, the electrode pads 8 of the wafer 7 are put in position on the aperture portions 4a of the circuit board 6 (see FIG. 5), pressed in a lump so as to be laminated (see FIG. 6). In such a manner, the seal of the active surface of the wafer 7 on which transistors or the like are disposed and the arrangement of the electrode pads 8 of the wafer 7 can be simultaneously performed with a wafer scale. Next, as shown in FIG. 7, solder balls 9 used for connection with a motherboard (not shown) are attached respectively in the aperture portions 3a, which are formed in the polyimide resin layer 3 and opened in the surface opposite to the surface on which the wafer 7 is stuck. After that, this lamination is diced so as to separate into individual chips 7a. In such a manner, CSPs 10 can be obtained (see FIG. 8). In FIG. 8, the reference numeral 6a represents a divided circuit board.

In this manufacturing method, the above-mentioned aperture portions 3a and 4a may be provided by use of laser such as gas laser, excimer laser or the like, or provided by wet-etching.

In addition, preferably, the above-mentioned adhesive 4 or the adhesive sheet is of the half-hardened type or thermoplastic type because it will be stuck on the wafer 7 later. Polyimide resin, epoxy resin, urethane resin, polyether imide resin, silicon resin, mixture of these resins, etc. are used.

In addition, in order to form the solder bumps 5, solder paste may be printed and reflowed into the aperture portions 4a, or solder balls may be temporarily fixed by means of flux in the aperture portions 4a and then reflowed. Otherwise, the solder bumps 5 may be formed by plating.

The above-mentioned solder balls 9 may be attached after dicing. In addition, the solder bumps 5 formed on the circuit board 6 side in FIG. 4 may be formed on the wafer 7 side in advance.

As for the solder used in the present invention, it is preferable that the melting point of the solder for connection with the wafer 7 is higher than the melting point of the solder for connection with the mother board. This is because the reliability of connection deteriorates if the solder in the wafer-scale package structure (the solder for connection with the electrode pads 8 of the wafer 7) melts at the temperature with which the wafer-scale package structure is mounted on the mother board.

On the other hand, if the wafer size increases, a warp may be occasionally produced when the circuit board 6 is stuck on all the surface of the wafer 7. In that case, the warp can be improved if metal foil 12 with low thermal expansivity is disposed in the polyimide resin layer 3 of the circuit board 6 in order to make the thermal expansivity of the circuit board 6 close to the thermal expansivity of the wafer 7. That is, the warp of the wafer 7 is produced by a difference in expansion between the circuit board 6 and the wafer 7 due to heat when they are stuck on each other. Therefore, the warp is reduced if the thermal expansivity of the circuit board 6 is made to approach the thermal expansivity of the wafer 7.

Figure 9:
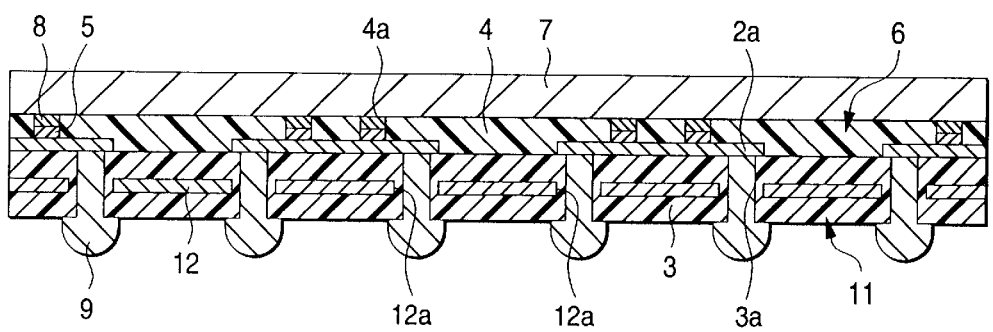
FIG. 9 is an explanatory view showing a modification of the above-mentioned wafer-scale package structure.

FIG. 9 shows the wafer-scale package structure in which the metal foil 12 with low thermal expansivity is disposed in the polyimide resin layer 3 of the two-layer base 11 of the circuit board 6. When the metal foil 12 with low thermal expansivity is thus disposed in the polyimide resin layer 3, the thermal expansivity of the circuit board 6 is reduced so that the warp can be restrained even if the circuit board 6 is stuck on the wafer 7 at a high temperature.

A method of manufacturing such a two-layer base 11 will be described.

Figure 10:
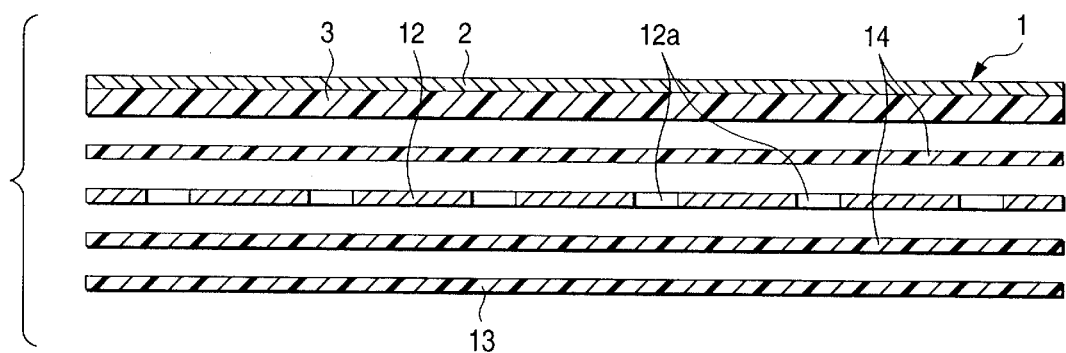
FIG. 10 is an explanatory view showing a manufacturing process of a circuit board used in the above-mentioned modification.

That is, a two-layer base 1 constituted by a copper layer 2 and a polyimide resin layer 3, low-thermal-expansivity metal foil 12 (for example, Fe—Ni alloy foil) having holes 12a formed in advance by means of a drill or the like, and a polyimide film 13 are laminated on one another through polyimide adhesive sheets 14 inserted therebetween (see FIG. 10). They are bonded under pressure and heat. In such a manner, a two-layer base 11 shown in FIG. 11 can be manufactured.

The thermal expansivity of the low-thermal-expansivity metal foil 12 used here is preferably not larger than 10 ppm/°

C. An example of the low-thermal-expansivity metal includes an iron-nickel alloy. This alloy has different thermal expansivity in accordance with the ratio of components. As for the ratio of components of the iron-nickel alloy used in this circuit board, the nickel content is preferably in a range of from 31 to 50% by weight. If the nickel content is out of this range, the thermal expansivity is larger than 10 ppm/° C., so that the warp produced when the circuit board 6 is stuck on the wafer 7 cannot be restrained satisfactorily.

The thickness of the metal foil 12 is set to be within a range of from 10 to 200 μm, preferably within a range of from 10 to 100 μm, more preferably within a range of from 10 to 50 μm. If the thickness is below this range, it is impossible to restrict the thermal expansivity of the circuit board 6. On the other hand, if the thickness is above the range, it is difficult to cut the wafer-scale package structure into individual packages.

Next, an embodiment of the present invention will be described with reference to the drawings.

FIG. 7 shows an embodiment of a wafer-scale package structure according to the present invention. In FIG. 7, the reference numeral 1 represents a two-layer base constituted by a copper layer 2 and a polyimide resin layer 3. The reference numeral 4 represents an adhesive. Electrode pads 8 of an wafer 7 and the surface of a circuit 2a of a circuit board 6 are connected by solder 5 provided in aperture portions 4a of this adhesive 4. The reference numeral 9 represents solder balls provided in aperture portions 3a of the polyimide resin layer 3 of the circuit board 6.

Such a wafer-scale package structure can be manufactured in the following manner. That is, first, the two-layer base 1 constituted by the copper layer 2 and the polyimide resin layer 3 is prepared (see FIG. 1). Next, the circuit 2a is formed in the copper layer 2 by etching, and the aperture portions 3a are formed in the polyimide resin layer 3 by means of excimer laser (see FIG. 2). Next, as shown in FIG. 3, the polyimide adhesive sheet 4 is bonded with the surface of the circuit 2a of the two-layer base 1 under pressure and heat. After that, apertures are formed by means of excimer laser. Next, solder paste is screen-printed in these aperture portions 4a, and reflowed in a nitrogen atmosphere. After that, flux is cleansed therefrom so that solder bumps 5 are formed (see FIG. 4). The solder bumps 5 of the circuit board 6 manufactured thus are put in position on electrode pads 8 of the wafer 7, bonded therewith under pressure and heat, further heated under pressure, and immediately cooled. After that, the solder balls 9 are temporarily fixed by means of flux to the aperture portions 3a opened in the surface opposite to the wafer 7, and reflowed at a nitrogen atmosphere. After that, the flux is cleansed therefrom. Thus, the solder balls 9 are attached (see FIG. 7). In such a manner, it is possible to manufacture such a wafer-scale package structure. After that, this wafer-scale package structure is diced to thereby obtain a large number of CSPs 10.

In the above-mentioned embodiment, after the electrode pads 8 are rearranged in a lump and in the form of the wafer 7, the wafer 7 is cut into the individual CSPs 10 as described above. Accordingly, the productivity is high while the cost is low.

Figure 11:
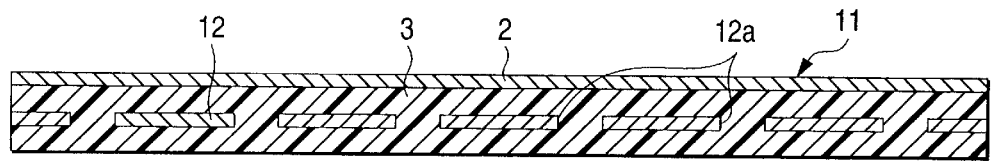
FIG. 11 is an explanatory view showing a circuit board manufactured by the process shown in FIG. 10.

Although the two-layer base 1 constituted by the copper layer 2 and the polyimide resin layer 3 was used as a two-layer base 1 in the above-mentioned embodiment, this two-layer base 1 may be replaced by a two-layer base 11 including metal foil 12 with low thermal expansivity as shown in FIG. 11.

Next, examples will be described.

EXAMPLE 1

A two-layer base 1 constituted by a copper layer 2 (having a thickness of 18 μm) and a polyimide resin layer 3 (having a thickness of 25 μm) was prepared (see FIG. 1). Next, a circuit 2a was formed by etching, and aperture portions 3a each having a diameter of 300 μm were formed in the polyimide resin layer 3 by means of excimer laser (see FIG. 2). Next, a polyimide adhesive sheet 4 (made by Nippon Steel Chemical Co., Ltd; SPB-035A) was bonded with the surface of the circuit 2a under pressure and heat (at 30 kg/cm$^2$ and 180° C. for 30 minutes) (see FIG. 3). After that, apertures each having a diameter of 100 μm were formed by means of excimer laser. Solder paste (made by Nihon Superior Co.,Ltd.; Sn8RA-3AMQ, melting point 240° C.) was screen-printed in these aperture portions 4a, and reflowed in a nitrogen atmosphere. After that, flux was cleansed therefrom so that solder bumps 5 were formed (see FIG. 4). The solder bumps 5 of the circuit board 6 manufactured thus were put in position on electrode pads 8 (subjected to Au flash plating) of a wafer 7, bonded therewith under pressure and heat (at 40 kg/cm$^2$ and 175° C. for 1 hour), further heated up to 260° C. under pressure, and immediately cooled down. After that, solder balls 9 (each having a diameter of 500 μm and a melting point of 183° C.) were temporarily fixed by means of flux to the aperture portions 3a opened in the surface opposite to the surface bonded with the wafer 7, and reflowed at a nitrogen atmosphere. After that, the flux is cleansed therefrom so that the solder balls 9 are attached (see FIG. 7).

EXAMPLE 2

A two-layer base 11 including low-thermal-expansivity metal foil 12 in a polyimide resin layer 3 (see FIG. 11) was used instead of the two-layer base 1 constituted by the copper layer 2 and the polyimide resin layer 3 which was used in Example 1. A wafer-scale package structure was manufactured in the same manner as in Example 1 except the above-mentioned point.

The above-mentioned two-layer base 11 including the metal foil 12 was manufactured as follows.

The two-layer base 1 constituted by the copper layer 2 and the polyimide resin layer 3 used in Example 1, Fe—Ni alloy foil 12 (Ni content: 36% by weight, thickness: 30 μm) with apertures 12a each having a diameter of 500 μm formed in advance by a drill, and a polyimide film 13 (made by Du Pont-Toray Co., Ltd.; Kapton 25 μm thick) were laminated through polyimide adhesive sheets 14 (made by Nippon Steel Chemical Co., Ltd; SPB-035A) as shown in FIG. 10, and bonded under pressure and heat (at 40 kg/cm$^2$ and 200° C. for 1 hour), so that a two-layer base 11 was manufactured.

The wafer-scale package structures in Examples 1 and 2 manufactured thus can be used as chip-size packages (CSPs) after they are diced into individual packages.

As has been described, according to a wafer-scale package structure in the present invention, the seal of the functional surface of a wafer and the rearrangement of wafer electrode pads are performed, at the same time, in a lump and in the form of the wafer. Accordingly, it is possible to manufacture CSPs extremely efficiently, so that the productivity gets high and the cost becomes low. In addition, in the circuit board according to the present invention, solder bumps are formed respectively in electrode portions of the circuit board. The connection between the wafer and the circuit board is performed by means of these solder bumps, so that all the connections can be performed in a lump. Accordingly, the electric reliability is also extremely high.

In the wafer-scale package structure according to the present invention, the above-mentioned insulating layer includes metal foil with low thermal expansivity. In this case, the thermal expansivity of the circuit board can be reduced by this metal foil and made close to the thermal expansivity of the wafer. Accordingly, a warp of the wafer is reduced.

In the circuit board according to the present invention, solder bumps are formed in electrode portions of the circuit board corresponding to electric connection portions of a mother board to make electric connection between the circuit board and the mother board. In this case, it is not necessary to mount solder balls anew after the circuit board is stuck on the wafer.

According to the present invention, the melting point of the solder provided in the electrode portions of the circuit board corresponding to the electrode pads is made higher than the melting point of the solder provided in the electrode portions of the circuit board corresponding to the electric connection portions of the mother board. In this case, there is no fear that the solder in the wafer-scale package structure (solder for connection with the electrode pads) melts at the temperature in which the circuit board is mounted on the mother board. Accordingly, there is no fear that the reliability of the connection is reduced by the mounting of the circuit board onto the mother board.

Although the invention has been described in its preferred formed with a certain degree of particularity, it is understood that the present disclosure of the preferred form can be changed in the details of construction and in the combination and arrangement of parts without departing from the spirit and the scope of the invention as hereinafter claimed.

What is claimed is:

1. A wafer-scale package structure comprising:
   a wafer having electrode pads;
   a circuit board being laminated on said wafer to rearrange said electrode pads of said wafer and being made of an insulating layer made from insulating resin as a main ingredient;
   an adhesive for laminating said circuit board on said wafer; and
   a conductive member for connecting said electrode pads of said wafer and said circuit board,
   wherein said wafer and said circuit board can be divided into individual chip-size packages simultaneously, and
   wherein said insulating layer includes a metal foil.

2. A wafer-scale package structure according to claim 1, wherein thermal expansivity of said metal foil is not larger than 10 ppm/° C.

3. A wafer-scale package structure according to claim 1, wherein said metal foil comprises iron-nickel alloy.

4. A wafer-scale package structure according to claim 3, wherein nickel content of iron-nickel alloy of said metal foil is in a range of from 31 to 50% by weight.

5. A wafer-scale package structure comprising:
   a wafer having electrode pads;
   a circuit board being laminated on said wafer to rearrange said electrode pads of said wafer and being made of an insulating layer made from insulating resin as a main ingredient;
   an adhesive for laminating said circuit board on said wafer; and
   a conductive member for connecting said electrode pads of said wafer and said circuit board,
   wherein said wafer and said circuit board can be divided into individual chip-size packages simultaneously, and
   wherein said conductive member comprises solder.

6. A wafer-scale package structure according to claim 5, further comprising:
   solder balls being formed on electrode portions of said circuit board and facing away from said conductive member, said solder balls adapted to make electric connections between said circuit board and a mother board.

7. A wafer-scale package structure according to claim 5, wherein a melting point of said solder of said conductive member is higher than a melting point of said solder balls.

8. A circuit board to be laminated on a wafer to thereby form a wafer-scale package structure to rearrange electrode pads of the wafer, said circuit board comprising:
   an insulating layer made from insulating resin as a main ingredient;
   a circuit formed on said insulating layer; and
   a conductive member for connecting the electrode pads of the wafer and said circuit, said conductive member being formed on electrode portions of said circuit corresponding to the electrode pads of the wafer to make connections between said electrode portions of said circuit and the electrode pads of the wafer,
   wherein said insulating layer includes a metal foil.

9. A circuit board according to claim 8, wherein thermal expansivity of said metal foil is not larger than 10 ppm/° C.

10. A circuit board according to claim 8, wherein said metal foil comprises iron-nickel alloy.

11. A circuit board according to claim 10, wherein nickel content of iron-nickel alloy of said metal foil is in a range of from 31 to 50% by weight.

12. A circuit board to be laminated on a wafer to thereby form a wafer-scale package structure to rearrange electrode pads of the wafer, said circuit board comprising:
   an insulating layer made from insulating resin as a main ingredient;
   a circuit formed on said insulating layer; and
   a conductive member for connecting the electrode pads of the wafer and said circuit, said conductive member being formed on electrode portions of said circuit corresponding to the electrode pads of the wafer to make connections between said electrode portions of said circuit and the electrode pads of the wafer,
   wherein said conductive member comprises solder.

13. A circuit board according to claim 12, further comprising:
   solder balls being formed on the electrode portions of said circuit and facing away from said conductive member, said solder balls adapted to make electric connections between said circuit and a mother board.

14. A circuit board according to claim 13, wherein a melting point of said solder of said conductive member is higher than a melting point of said solder balls.

* * * * *